(12) United States Patent
Finn

(10) Patent No.: US 10,644,699 B2
(45) Date of Patent: May 5, 2020

(54) LOWER VOLTAGE SWITCHING OF CURRENT MODE LOGIC CIRCUITS

(71) Applicant: TEXAS INSTRUMENTS INCORPORATED, Dallas, TX (US)

(72) Inventor: Steven Ernest Finn, Chamblee, GA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 77 days.

(21) Appl. No.: 15/993,725

(22) Filed: May 31, 2018

(65) Prior Publication Data
US 2019/0372571 A1   Dec. 5, 2019

(51) Int. Cl.
*H03K 19/00* (2006.01)
*H03K 19/0944* (2006.01)
*H03K 19/0175* (2006.01)

(52) U.S. Cl.
CPC ....... *H03K 19/0016* (2013.01); *H03K 19/001* (2013.01); *H03K 19/0013* (2013.01); *H03K 19/017554* (2013.01); *H03K 19/09448* (2013.01)

(58) Field of Classification Search
CPC ............. H03K 19/0016; H03K 19/001; H03K 19/09448; H03K 19/017554; H03K 19/0013
See application file for complete search history.

(56) References Cited

U.S. PATENT DOCUMENTS

| 4,988,898 A | 1/1991 | Jansson | |
| 6,169,421 B1* | 1/2001 | Bryan | H03K 19/0013 326/83 |
| 7,982,542 B1* | 7/2011 | Sicard | H03F 3/4508 330/257 |
| 2003/0132797 A1* | 7/2003 | Mohieldin | H03H 11/1213 327/552 |
| 2007/0120600 A1 | 5/2007 | Byun et al. | |

(Continued)

FOREIGN PATENT DOCUMENTS

| RU | 23943 | 7/2001 |
| RU | 2460206 | 8/2012 |

OTHER PUBLICATIONS

Usama, Muhammad and Tad Kwasniewski, "New CML Latch Structure for High Speed Prescaler Design." CCECE 2004-CCGEI 2004, Niagra Falls, May 2004.

(Continued)

*Primary Examiner* — Patrick C Chen
(74) *Attorney, Agent, or Firm* — John R. Pessetto; Charles A. Brill; Frank D. Cimino

(57) ABSTRACT

A circuit includes a first transistor comprising a first control input and first and second current terminals, the first control input coupled to receive a first input control signal, and the first current terminal coupled to a first power supply node. The circuit also includes a first resistor coupled to the first control input of the first transistor, a first capacitor coupled between the second current terminal of the first transistor and the first resistor and a second transistor comprising a second control input and third and fourth current terminals, the third current terminal coupled to the first resistor and to the first capacitor.

9 Claims, 2 Drawing Sheets

(56) References Cited

U.S. PATENT DOCUMENTS

2012/0229174 A1* 9/2012 Shiah ............. H03K 19/018521
　　　　　　　　　　　　　　　　　　　　　327/109
2014/0062609 A1* 3/2014 Lee ........................ H03B 5/364
　　　　　　　　　　　　　　　　　　　　　331/116 FE

OTHER PUBLICATIONS

International Search Report in corresponding PCT Application No. PCT/US2019/034176, dated Aug. 29, 2019 (2 pages).

* cited by examiner

US 10,644,699 B2

LOWER VOLTAGE SWITCHING OF CURRENT MODE LOGIC CIRCUITS

BACKGROUND

Many circuit applications are more valuable as the speed of the circuits increases. Examples of such circuits include latches, flip-flops, multiplexers, and combinatorial logic. Some approaches to increasing speed unfortunately also involve increased power consumption.

SUMMARY

In one example, a circuit includes a first transistor comprising a first control input and first and second current terminals, the first control input coupled to receive a first input control signal, and the first current terminal coupled to a first power supply node. The circuit also includes a first resistor coupled to the first control input of the first transistor, a first capacitor coupled between the second current terminal of the first transistor and the first resistor and a second transistor comprising a second control input and third and fourth current terminals, the third current terminal coupled to the first resistor and to the first capacitor.

In another example, a circuit includes a first transistor comprising a first control input and first and second current terminals, the first control input coupled to receive a first input control signal, and the first current terminal coupled to a first power supply node. The circuit also includes a first resistor coupled to the first control input of the first transistor, a first capacitor coupled between the second current terminal of the first transistor and the first resistor, and a second transistor comprising a second control input and third and fourth current terminals, the third current terminal coupled to the first resistor and to the first capacitor. A third transistor also is included which comprises a third control input and seventh and eighth current terminals, the third control input coupled to receive a second input control signal, the second input control signal being reciprocal to the first input control signal. The circuit further includes a second resistor coupled to the third control input, a second capacitor coupled between the sixth current terminal and the second resistor, and a fourth transistor comprising a fourth control input and seventh and eighth current terminals, the seventh current terminal coupled to the second resistor and to the second capacitor.

In yet another example, a circuit includes a first transistor comprising a first control input and first and second current terminals, the first control input coupled to receive a time-varying first input control signal, a first resistor coupled to the first control input of the first transistor and a first high pass filter coupled to the second current terminal and to the first resistor at a first output node, the first high pass filter having a first cut-off frequency. The voltage on the second current terminal of the first transmitter is provided through the first high pass filter to the first output node at frequencies of the time-varying first input control signal above the first cut-off frequency. At frequencies of the time-varying first input control signal below the first cut-off frequency, the voltage on the first output node is a voltage drop across the first resistor less than the time-varying first input control signal.

BRIEF DESCRIPTION OF THE DRAWINGS

For a detailed description of various examples, reference will now be made to the accompanying drawings in which.

DETAILED DESCRIPTION

The disclosed examples are directed to a circuit for driving current mode logic (CML) circuits. The disclosed drive circuit is such that the CML logic can be operated from a lower voltage power supply than would have otherwise been used. In some prior CML implementations, the circuit that generates the control signals for the CML-based functional circuit includes a stacked arrangement of bipolar junction transistors (e.g., n-type bipolar junction transistors). As a result of the stacked bipolar junction transistors (BJTs) and based on other headroom issues within the CML-based circuit, the power supply voltage is greater than or equal to a certain minimum value, which currently is around 2.5V. Part of the headroom issue driving the selection of a power supply voltage is the base-to-emitter voltage (Vbe) of a BJT. With the stacked BJT arrangement, at least 2*Vbe is needed for the power supply voltage, and more than that based on other headroom issues. A Vbe voltage is approximately 0.8V and thus 2*Vbe is approximately 1.6V. Including other headroom issues associated with CML circuits, the power supply voltage is generally at least 2.5V.

The disclosed circuit for producing the control signals to operate a CML functional circuit (e.g., a CML latch, a CML multiplexer, a CML flip-flop, etc.) does not use a stacked BJT arrangement and can produce a suitable voltage for the CML logic while using a lower supply voltage. In one example, the supply voltage is 1.5V.

Figure 1:
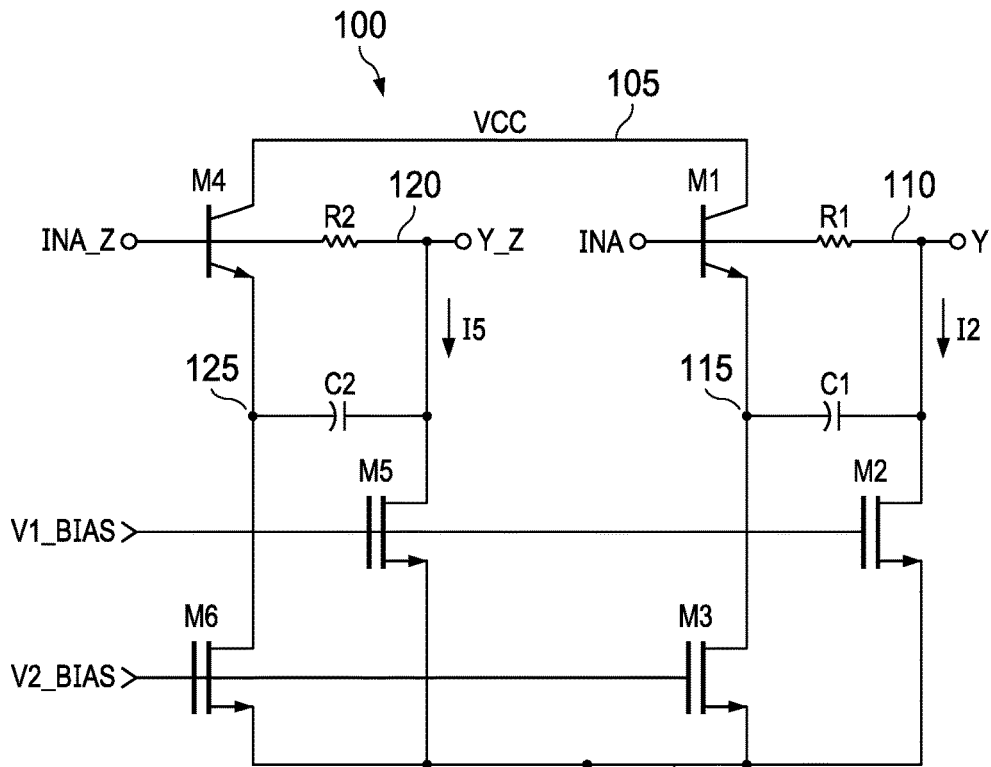
FIG. 1 illustrates a control signal drive circuit in accordance with an example.

FIG. 1 shows a control signal drive circuit 100 in accordance with an example. The control signal drive circuit 100 in this example receives input control signals INA and INA_Z and produces output signals Y and Y_Z that are level-shifted with respect to the INA and INA_Z. The input control signals INA and INA_Z are time-varying signals that are reciprocal to each other and that have a DC level. It is the DC level of the input control signals INA and INA_Z that is level-shifted by the control signal driver circuit 100 so that the output signals Y and Y_Z are time-varying with a shape and timing that is generally the same as the input control signals INA and INA_Z but at a different DC voltage level. The level shift of the input control signals ensures that the output signals Y and Y_Z are at voltages that are adequate to control the control inputs of transistors in a downstream CML functional circuit.

Each of the input control signals INA and INA_Z have a similar circuit to convert the input signal to a corresponding output signal. For example, the control signal drive circuit 100 includes transistors M1, M2, and M3, resistor R1, and capacitor C1 for input signal INA. The control signal drive circuit 100 includes transistors M4, M5, and M6, resistor R2, and capacitor C2 for input control signal INA_Z, In this example, M1 and M4 are n-type BJTs and M2, M3, M5 and M6 are n-type metal oxide semiconductor field effect transistors (NMOS). In other implementations, the transistors M1-M6 can be of other types. For example, M1 and M4 can be implemented as p-type BJTs and any of M2, M3, M5, and M6 can be implemented as p-type metal oxide semiconductor field effect transistors (PMOS) or as BJTs. Each transistor M1-M6 has a control input and a pair of current terminals. In the case of a BJT (e.g., M1 and M4), the control input is the base of the transistors and the current terminals are the transistor's collector and emitter. In the case of an NMOS or PMOS device, the control input is the transistor's gate and the current terminals are the transistor's source and drain.

Input signal INA is provided to the base of M1 and to one terminal of R1. The collector of M1 is connected to a power supply node 105 (e.g. VCC). The other terminal of R1 (node 110) represents the output signal Y. Capacitor C1 connects to the emitter of M1 and to the resistor R1 at node 110. The drain of M2 also connects to capacitor C1 and resistor R1 at node 110 as shown. The source of M2 is connected to a power supply node 107 (e.g., ground). The drain of M3 is connected to the emitter of M1 and to capacitor C1, and the source of M3 is connected to power supply node 107. The gate of M2 is biased by way of bias voltage V1_BIAS and the gate of M3 is biased by way of bias voltage V2_BIAS.

The architecture of the control signal drive circuit 100 with respect to input control signal INA_Z is similar to that described above regarding input control signal INA. Input signal INA_Z is provided to the base of M4 and to one terminal of R2. The collector of M4 is connected to the power supply node 105. The other terminal of R2 (node 120) represents the output signal Y_Z. Capacitor C2 connects to the emitter of M4 and to the resistor R2 at node 120. The drain of M5 also connects to capacitor C2 and resistor R2 at node 120 as shown. The source of M5 is connected to power supply node 107. The drain of M6 is connected to the emitter of M4 and to capacitor C1, and the source of M3 is connected to power supply node 107.

The gate of M5 is biased by way of bias voltage V1_BIAS and the gate of M6 is biased by way of bias voltage V2_BIAS. Transistors M2 and M5 are of equal size in some implementations and thus being biased by the same bias voltage V1_BIAS causes the current through M2 (designed as I2 in FIG. 1) to be approximately the same as the current through M5 (designated as I5). Similarly, transistors M3 and M6 are of equal size in some implementations and thus being biased by the same bias voltage V2_BIAS causes the drain current through M3 to be approximately the same as the drain current through M5.

Capacitor C1 is part of a high pass filter. The resistance of the downstream circuit as viewed from node 110, coupled with C1 forms the high pass filter. As noted above, INA is a time-varying signal with a DC component. The high pass filter permits the frequency components on the emitter of M1 above the filter's cut-off frequency to pass through C1 to the output signal Y at node 110. As M1 is controlled by time-varying input control signal INA, the voltage on node 115 also is time-varying with the same frequency and duty cycle as INA, and is generally synchronous to INA. Through C1 of the high pass filter, the output signal Y will have a time-varying component that also is synchronous to the input control signal INA.

The aforementioned high pass filter will not permit the DC component of INA to pass through to the output signal Y. Instead, the DC component of the output signal Y will be equal to the DC voltage of INA less the voltage drop across R1. The voltage drop across R1 is the resistance value of R1 multiplied by the current through R1. The current through R1 is I2 and is controlled by M2 and the bias voltage V1_BIAS provided to the gate of M2. Thus, the DC component of Y is INA−(R1)(I2). By selection of R1 and the current I2 through M2 (and thus through R1), the voltage drop across R1 can be set as desired. In one example, the voltage drop across R1 is 400 mv, which is significantly less than a Vbe (about 800 mv). As such, the control signal drive circuit of FIG. 1 is able to generate a suitable DC level for output signal Y while using a smaller supply voltage for VCC than would have been possible if a stacked BJT arrangement was used instead.

The generation of output signal Y_Z is similar to that described above. C2 is part of a high pass filter that includes the resistance of the downstream circuit as viewed from node 120, The signal on node 125 is time-varying with the same frequency and duty cycle as INA_Z, and is generally synchronous to INA_Z. Through C2 of the high pass filter, the output signal Y_Z will have a time-varying component that also is synchronous to the input control signal INA_Z and, through R2, have a DC component that is I5*R2 less than the DC component of INA_Z.

Figure 2:
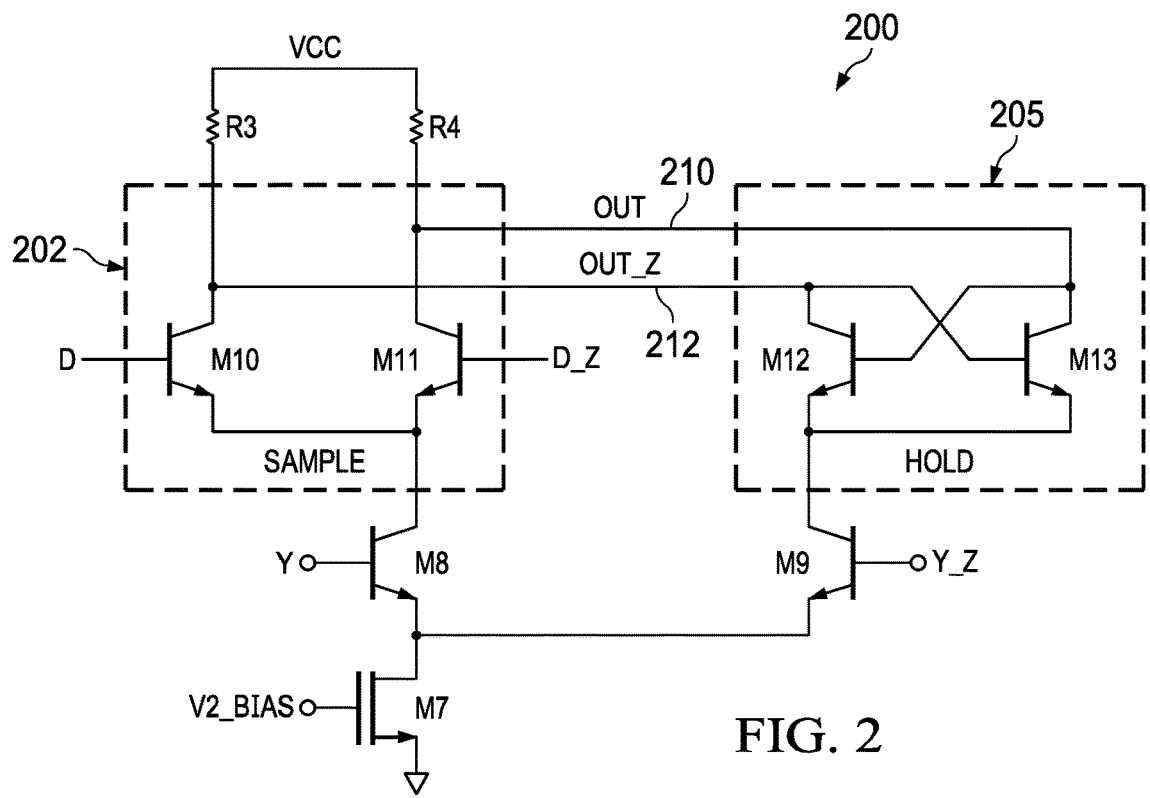
FIG. 2 illustrates a latch circuit usable with level-shifted output control signals from the control signal drive circuit of FIG. 1.

The control signal drive circuit 100 can be used to provide control signals Y and Y_Z for any of a variety of downstream CML functional circuits. FIG. 2 shows an example of a CML latch 200 implemented. The illustrative CML latch 200 includes a sample circuit 202 comprising transistors M10 and M11, a hold circuit comprising transistors M12 and M13, resistors R3 and R4, a current source transistor M7 and transistors M8 and M9. Transistors M10 and M11 receive a differential data D and D_Z. Transistors M8 and M9 receive the output signals Y and Y_Z, respectively, from FIG. 1. When Y is greater than Y_Z, current flows from VCC, through one or the other of M10 M11 depending on whether D is larger or smaller than D_Z through M8 and M7 to ground. M7 is biased using V2_BIAS to cause a fixed current level to flow from VCC to ground through the sample circuit 202, M8 and M7.

The output signals OUT and OUT_Z from the CML latch 200 are taken from nodes 210 and 212 as shown. When D is large enough to turn on M10, OUT_Z becomes VCC less the voltage drop across R3 (which his R3 times the current defined by current source device comprising M7). With D high, D_Z is low and thus M11 is off and thus OUT is high (i.e., higher than OUT_Z). OUT and OUT_Z are at the opposite voltage levels when D_Z is greater than D. With Y asserted high, OUT and OUT_Z track the input data signals D and D_Z in a transparent mode of operation of the latch. When Y_Z becomes high (and Y becomes low), current ceases to flow through the sample circuit 202 and, instead flows through the hold circuit 205 and through M9 and M7. The transistors M12 and M13 of the hold circuit are connected in a cross-coupled arrangement to operate in a regenerative positive feedback mode. As such, the output signals OUT and OUT_Z are held at their voltage levels on nodes 210 and 212 when Y_Z is high as no current will flow through the sample circuit 202 and the current instead flows through the hold circuit.

The Y and Y_Z signals operate the CML latch as described above and are generated by the control signal drive circuit 100 of FIG. 1. The power supply VCC used to operate the control signal drive circuit 100 of FIG. 1 and the CML latch 200 of FIG. 2 can be a smaller voltage level than would have been the case if a stacked arrangement of BJTs were used to generate the control signals Y and Y_Z for the CML latch. In one embodiment, VCC is greater than or equal to 1.5V (e.g., between 1.5V and 2.5V).

Figure 3:
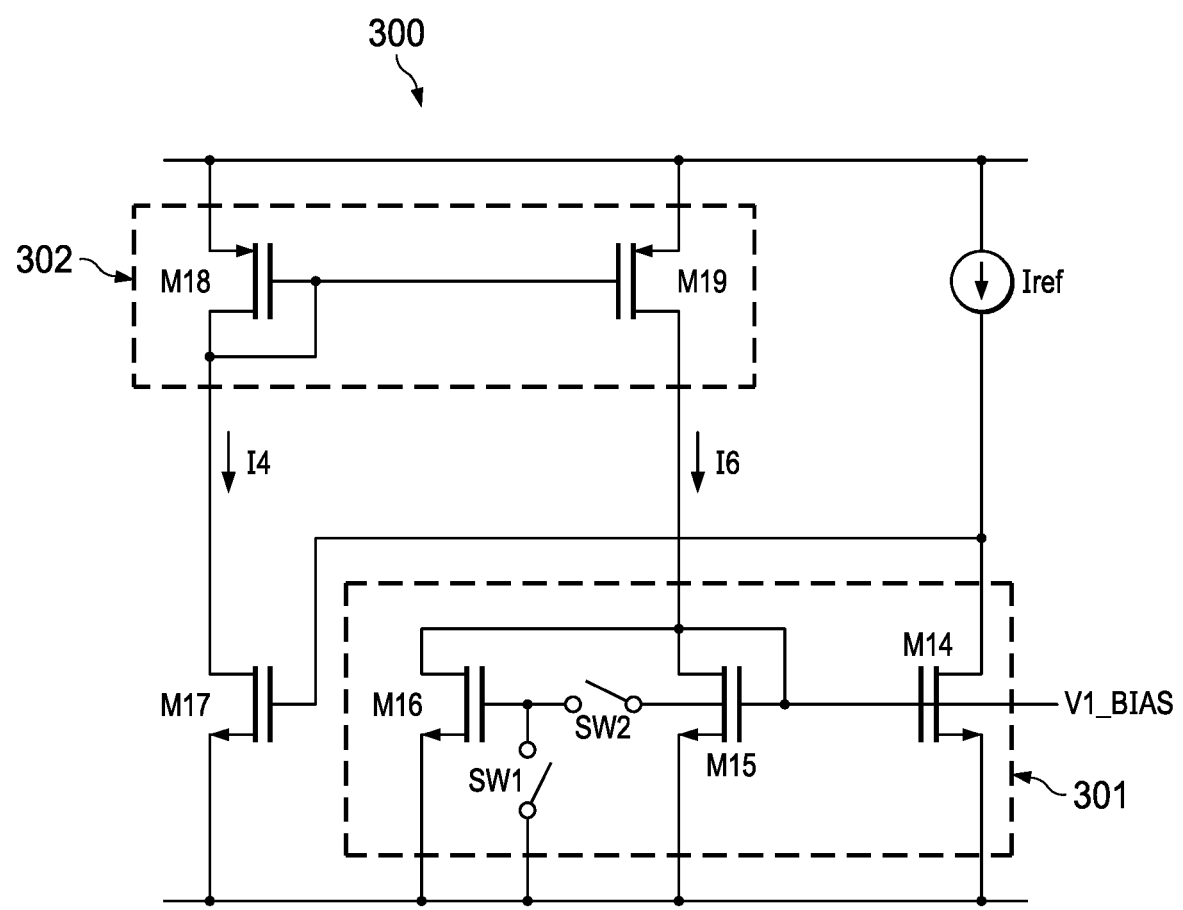
FIG. 3 illustrates a bias generation circuit to generate an adjustable bias voltage usable in the circuit of FIG. 1.

FIG. 3 shows an example of bias generation circuit 300 usable to generate the bias voltage shown as V1_BIAS in FIG. 1. V1_BIAS is generated in the example circuit of FIG. 3 to be an adjustable bias voltage. This circuit can operate at relatively low supply voltages, for example 1.5V, while offering a suitable drive impedance to the control signal drive circuit 100 of FIG. 1. Iref is applied to the drain of M14 and the voltage on the gate of M14 is set by negative feedback to the value required for the drain of M14 to source the current Iref. The negative feedback operation is achieved by transistors M14, M15, M16, M17, M18, and M19. Transistors M18 and M19 comprise a PMOS current mirror from 14 to 16 to reflect the drain current of M17 onto M15 and, if enabled by switch SW1 and SW2, M16. Transistors M14, M15, and M16 comprise another current mirror 301. M15 is always enabled in this example and provides a baseline current mirror ratio between M15 and M14 equivalent to [W(M14)/L(M14)]/[W(M14)/L(M15)], where W and L indicate transistor width and length. The gate of M16 is connected to VI_BIAS in order to adjust the overall current mirror ratio to [W(M14)/L(M14)]/[W(M15)/L(M15)+W(163)/L(M16)]. The gate of M17 is connected to the drain of M4 and to Iref. The voltage at the gate of M17 is set by negative feedback through current mirrors 301 and 302 to satisfy the current mirror ratios with Iref as the input to the circuit. Additional transistors can be added in addition to M15 and M16 in similar fashion to provide programmable current mirror ratios. Finally, V1_BIAS is connected to M2 and M5 of control signal drive circuit 100 in FIG. 1 to generate currents I2 and I5. These currents can be adjusted by the mirror ratio of current mirror 301.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit, comprising:
a first transistor comprising a first control input and first and second current terminals, the first control input coupled to receive a first input control signal, and the first current terminal coupled to a first power supply node;
a first resistor coupled to the first control input of the first transistor;
a first capacitor coupled between the second current terminal of the first transistor and the first resistor;
a second transistor comprising a second control input and third and fourth current terminals, the third current terminal coupled to the first resistor and to the first capacitor;
a third transistor comprising a third control input and fifth and sixth current terminals, the fifth current terminal coupled to the second current terminal and the sixth current terminal coupled to a second power supply node;
a fourth transistor comprising a fourth control input and seventh and eighth current terminals, the fourth control input coupled to receive a second input control signal, the second input control signal being reciprocal to the first input control signal;
a second resistor coupled to the fourth control input of the fourth transistor;
a second capacitor coupled between the eighth current terminal of the fourth transistor and the second resistor; and
a fifth transistor comprising a fifth control input and ninth and tenth current terminals, the ninth current terminal coupled to the second resistor and to the second capacitor;
further comprising a latch, the latch including:
a pair of input transistors including control inputs coupled to the first and second resistors, respectively;
a pair of cross-coupled transistors coupled to one of the transistors of the pair of input transistors; and
a data pair of transistors including control inputs coupled to receive first and second data input signals to be held on output nodes of the latch responsive to voltages from the first and second resistors.

2. A circuit, comprising:
a first transistor comprising a first control input and first and second current terminals, the first control input coupled to receive a first input control signal, and the first current terminal coupled to a first power supply node;
a first resistor coupled to the first control input of the first transistor;
a first capacitor coupled between the second current terminal of the first transistor and the first resistor;
a second transistor comprising a second control input and third and fourth current terminals, the third current terminal coupled to the first resistor and to the first capacitor;
a third transistor comprising a third control input and seventh and eighth current terminals, the third control input coupled to receive a second input control signal, the second input control signal being reciprocal to the first input control signal; and
a second resistor coupled to the third control input;
a second capacitor coupled between the sixth current terminal and the second resistor; and
a fourth transistor comprising a fourth control input and seventh and eighth current terminals, the seventh current terminal coupled to the second resistor and to the second capacitor;
a first current source device coupled between the second current terminal and a second power supply node; and
a second current source device coupled between the sixth current terminal and the second power supply node.

3. The circuit of claim 2, wherein:
the second and fourth control inputs are coupled to receive a first common bias voltage; and
the first and second current source devices are biased with a second common bias voltage.

4. A circuit, comprising:
a first transistor comprising a first control input and first and second current terminals, the first control input coupled to receive a time-varying first input control signal;
a first resistor coupled to the first control input of the first transistor; and
a first high pass filter coupled to the second current terminal and to the first resistor at a first output node, the first high pass filter having a first cut-off frequency;

the voltage on the second current terminal of the first transistor provided through the first high pass filter to the first output node at frequencies of the time-varying first input control signal above the first cut-off frequency; and at frequencies of the time-varying first input control signal below the first cut-off frequency, the voltage on the first output node being a voltage drop across the first resistor less than the time-varying first input control signal.

5. The circuit of claim 4, wherein the first high pass filter includes a capacitor connected to the second current terminal and to the first output node.

6. The circuit of claim 5, further comprising a second transistor coupled between the output node and a power supply node and biased to conduct a predetermined amount of current through the first resistor.

7. The circuit of claim 4, further comprising:

a second transistor comprising a second control input and third and fourth current terminals, the second control input coupled to receive a time-varying second input control signal reciprocal to the time-varying first input control signal;

a second resistor coupled to the second control input of the second transistor; and a second high pass filter coupled to the fourth current terminal and to the second resistor at a second output node, the second high pass filter having a second cut-off frequency;

the voltage on the fourth current terminal of the second transmitter provided through the second high pass filter to the second output node at frequencies of the time-varying second input control signal above the second cut-off frequency; and at frequencies of the time-varying second input control signal below the second cut-off frequency, the voltage on the second output node being a voltage drop across the second resistor less than the second input control signal.

8. The circuit of claim 7 further comprising a third transistor coupled between the second current terminal and a power supply node and a fourth transistor coupled between the fourth current terminal and the power supply node.

9. The circuit of claim 8, wherein the first and second transistors are bipolar junction transistors and the third and fourth transistors are metal oxide semiconductor field effect transistors.

* * * * *